(12) United States Patent
Twitchell et al.

(10) Patent No.: US 6,519,010 B2
(45) Date of Patent: *Feb. 11, 2003

(54) BROADCAST TRANSMISSION SYSTEM WITH SAMPLING AND CORRECTION ARRANGEMENT FOR CORRECTING DISTORTION CAUSED BY AMPLIFYING AND SIGNAL CONDITIONING COMPONENTS

(75) Inventors: Edwin Ray Twitchell, San Jose, CA (US); Wayne D. Duello, Hamilton, OH (US); Robert J. Plonka, Quincy, IL (US)

(73) Assignee: Harris Corporation, Melbourne, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/905,560

(22) Filed: Jul. 13, 2001

(65) Prior Publication Data

US 2001/0038423 A1 Nov. 8, 2001

Related U.S. Application Data

(63) Continuation of application No. 09/312,344, filed on May 14, 1999, now Pat. No. 6,281,936, and a continuation of application No. 09/105,824, filed on Jun. 26, 1998, now Pat. No. 6,285,412.

(51) Int. Cl.[7] .............................. H04N 5/21; H03F 1/26
(52) U.S. Cl. ....................... 348/608; 348/723; 375/297; 330/149
(58) Field of Search ................................ 348/608, 723, 348/707, 470; 330/149; 455/127; 375/297

(56) References Cited

U.S. PATENT DOCUMENTS

| 4,291,277 A | 9/1981 | Davis et al. |
| 4,412,337 A | 10/1983 | Bickley et al. |
| 4,435,823 A | 3/1984 | Davis et al. |

(List continued on next page.)

OTHER PUBLICATIONS

Wright, Andrew S and Durtler, William G: "Experimental Performance of an Adaptive Digital Linearized Power Amplifier", IEEE MTT–S International Microwave Symposium Digest, vol. 2, Jun. 1–5, 1992, pp. 1105–1108, XP000343487, Albuquerque, NM, U.S.A.

Saleh, A A M and Salz, J.: "Adaptive Linearization of Power Amplifiers in Digital Radio Systems", The Bell System Technical Journal, vol. 62, No. 4, Part 1, Apr. 1983, pp. 1019–1033, XP002028354, Murray Hill, NJ, U.S.A.

*Primary Examiner*—Victor R. Kostak
(74) *Attorney, Agent, or Firm*—Tarolli, Sundheim, Covell, Tummino & Szabo L.L.P.

(57) ABSTRACT

A transmission system (14) broadcasts a signal. Within the system (14), a power amplifier (20) causes non-linear distortion. A pre-amp component, such as a band-pass filter (32), causes linear distortion. A high power filter (38) is located downstream of the power amplifier (20) and causes linear distortion. A linear equalizer (42) compensates for the distortion caused by the high power filter (38). A non-linear corrector (44) compensates for the distortion caused by the power amplifier (20), and is located downstream of the linear equalizer (42). A linear equalizer (46) compensates for the distortion caused by the pre-amp components (e.g., 32). The compensating components (42–46) are located upstream of the distorting, pre-amp component (e.g., 32). Signal sampling points (70–74) are located downstream of each distorting component (20, 32, and 38). Sampling selectively occurs at one of the sample points (70–74) for use to update compensation.

11 Claims, 3 Drawing Sheets

U.S. PATENT DOCUMENTS

| | | |
|---|---|---|
| 4,700,151 A | 10/1987 | Nagata |
| 4,947,363 A | 8/1990 | Williams |
| 5,049,832 A | 9/1991 | Cavers |
| 5,107,520 A | 4/1992 | Karam et al. |
| 5,448,206 A | 9/1995 | Newhall |
| 5,489,879 A | 2/1996 | English |
| 5,590,121 A | 12/1996 | Geigel et al. |
| 5,732,333 A | 3/1998 | Cox et al. |
| 5,745,006 A | 4/1998 | Budnik et al. |
| 5,748,678 A | 5/1998 | Valentine et al. |
| 5,751,766 A | 5/1998 | Kletsky et al. |
| 5,781,069 A * | 7/1998 | Baskin ........................ 330/149 |
| 5,900,778 A | 5/1999 | Stonick et al. |
| 5,910,965 A | 6/1999 | Ierfino et al. |
| 5,920,808 A | 7/1999 | Jones et al. |
| 5,923,712 A | 7/1999 | Leyendecker et al. |
| 5,959,500 A | 9/1999 | Garrido |
| 6,054,895 A | 4/2000 | Danielsons et al. |
| 6,075,411 A | 6/2000 | Briffa et al. |
| 6,081,158 A | 6/2000 | Twitchell et al. |
| 6,104,241 A | 8/2000 | Cova et al. |
| 6,141,390 A | 10/2000 | Cova |
| 6,141,541 A | 10/2000 | Midya et al. |
| RE36,987 E | 12/2000 | Tupper et al. |
| 6,252,912 B1 * | 6/2001 | Salinger ..................... 375/278 |
| 6,278,743 B1 * | 8/2001 | Templin ..................... 375/296 |

* cited by examiner

BROADCAST TRANSMISSION SYSTEM WITH SAMPLING AND CORRECTION ARRANGEMENT FOR CORRECTING DISTORTION CAUSED BY AMPLIFYING AND SIGNAL CONDITIONING COMPONENTS

RELATED APPLICATION

This application is a continuation of U.S. patent application Ser. No. 09/105,824, filed Jun. 26, 1998, now U.S. Pat. No. 6,285,412, and U.S. patent application Ser. No. 09/312,344, filed May 14, 1999, now U.S. Pat. No. 6,281,936.

TECHNICAL FIELD

The present invention relates to broadcast transmission systems and is particularly directed to compensation of distortion within a digital transmission system, such as a digital TV ("DTV") transmission system.

BACKGROUND OF THE INVENTION

A broadcast transmission system, such as a DTV broadcast system, includes an amplifying device that increases the power of an electrical information signal such that an antenna is excited to emit a broadcast signal at a desired strength. The amplifying device is referred to as a power amplifier. In order to optimize the quality of the broadcast signal, the electrical signal is conditioned prior to amplification. The signal conditioning includes band-pass filtering the electrical signal to limit the frequency band of the electrical signal that is input to the power amplifier.

Several issues arise during operation of such a transmission system. One issue is that the components of the transmission system, including the power amplifier and the signal conditioning devices, distort the electrical information signal away from intended values. Specifically, the power amplifier imposes non-linear distortion upon the signal. Also, some of the signal conditioning devices (e.g., band-limiting filter) impose linear distortions upon the information signal.

As a result of such distortions within the transmission system, instantaneous amplitude variations (AM/AM) and instantaneous phase variations (AM/PM) occur. In addition, frequency dependent amplitude and phase variations also occur. It is to be appreciated that within a phase-amplitude modulated system, amplitude and phase integrity of the system must be preserved for optimum system performance.

Traditional equalization for television systems has been accomplished by analog, pre-distortion equalizers and correctors that are static (non-adaptive). Such equalizers and correctors require factory adjustments to provide a desired amount of pre-distortion (pre-equalization). Aging of components, and temperature change cause drift in the proper amount of pre-distortion that should be imposed by the equalizers and correctors. Occasional field adjustments are required.

Digital signal processing techniques provide improved performance of the pre-distortion of the information signal. Specifically, digital signal processing can be used in an adaptive correction/equalization approach. Such an adaptive approach can eliminate the factory and field adjustments.

It is known to perform adaptive correction of a signal within a signal stream proceeding toward an antenna. However, in a relatively fast data system, the correction requires a relatively large amount of processing in a short period of time. In one known technique, all of the distortion (i.e., linear and non-linear) is corrected in a single step.

In another technique, the correction for the distortion imposed within the system is done component by component proceeding in a direction toward the antenna. Specifically, for each component, the signal that is output from that component is monitored to determine the amount of distortion imposed by that component. A correction is then developed for that component. Subsequently, the next component along the signal stream is monitored to develop the correction for that component. However, such a technique is time consuming and is often unsuitable for a high data rate stream. Thus, there is a need for a high-speed technique for adaptive correction of linear and non-linear distortion within a digital broadcast transmission system.

A second issue that presents itself is that the power amplifier may impose a frequency spectrum spread on the signal during amplification. The spreading may include smearing of the frequency and generation of unwanted frequency components. The frequency spread results in a broadcast signal of diminished quality. Additional signal conditioning, primarily in the form of band-pass filtering, after amplification will improve the quality of the broadcast signal. However, each additional signal-conditioning component (e.g., a band-pass filter) causes additional distortions to the signal. An increase in the number of distortion-causing components within the system is associated with an increase in the distortions that must be corrected. Practical signal processing systems have finite "real-time" processing capabilities and are subject to cost and complexity constraints. A system with a large number of distortion-causing components in a high data-rate system such as HDTV can easily exceed the capabilities of an implementable correction system.

SUMMARY OF THE INVENTION

The present invention provides a transmission system for broadcasting an information signal. The system includes signal provision means for providing an information signal. Power amplifier means amplifies the information signal to a broadcast transmission power level. The power amplifier means subjects the information signal to distortion shifts away from intended values. Pre-amp conditioning means conditions the information signal before the information signal is amplified by the power amplifier means. The pre-amp conditioning means is located upstream of the power amplifier means. The pre-amp conditioning means subjects the information signal to distortion shifts away from intended values. Post-amp conditioning means conditions the information signal after the information signal is amplified by the power amplifier means. The post-amp conditioning means is located downstream of the power amplifier means. The post-amp conditioning means subjects the information signal to distortion shifts away from intended values. First compensating means modifies the information signal to compensate for the distortion shifts imposed by the post-amp conditioning means. The first compensating means is located upstream of the pre-amp conditioning means. Second compensating means modifies the information signal to compensate for the distortion shifts imposed by the power amplifier means. The second compensating means is located downstream of the first compensating means and upstream of the pre-amp conditioning means. Third compensating means modifies the information signal to compensate for the distortion shifts imposed by the pre-amp conditioning means. The third compensating means is located downstream of the second compensating means and upstream of the pre-amp conditioning means.

BRIEF DESCRIPTION OF THE DRAWINGS

The foregoing and other features of the present invention will become apparent to one skilled in the art to which the present invention relates upon reading the following description of the invention with reference to the accompanying drawings, wherein.

DESCRIPTION OF A PREFERRED EMBODIMENT

Figure 1:
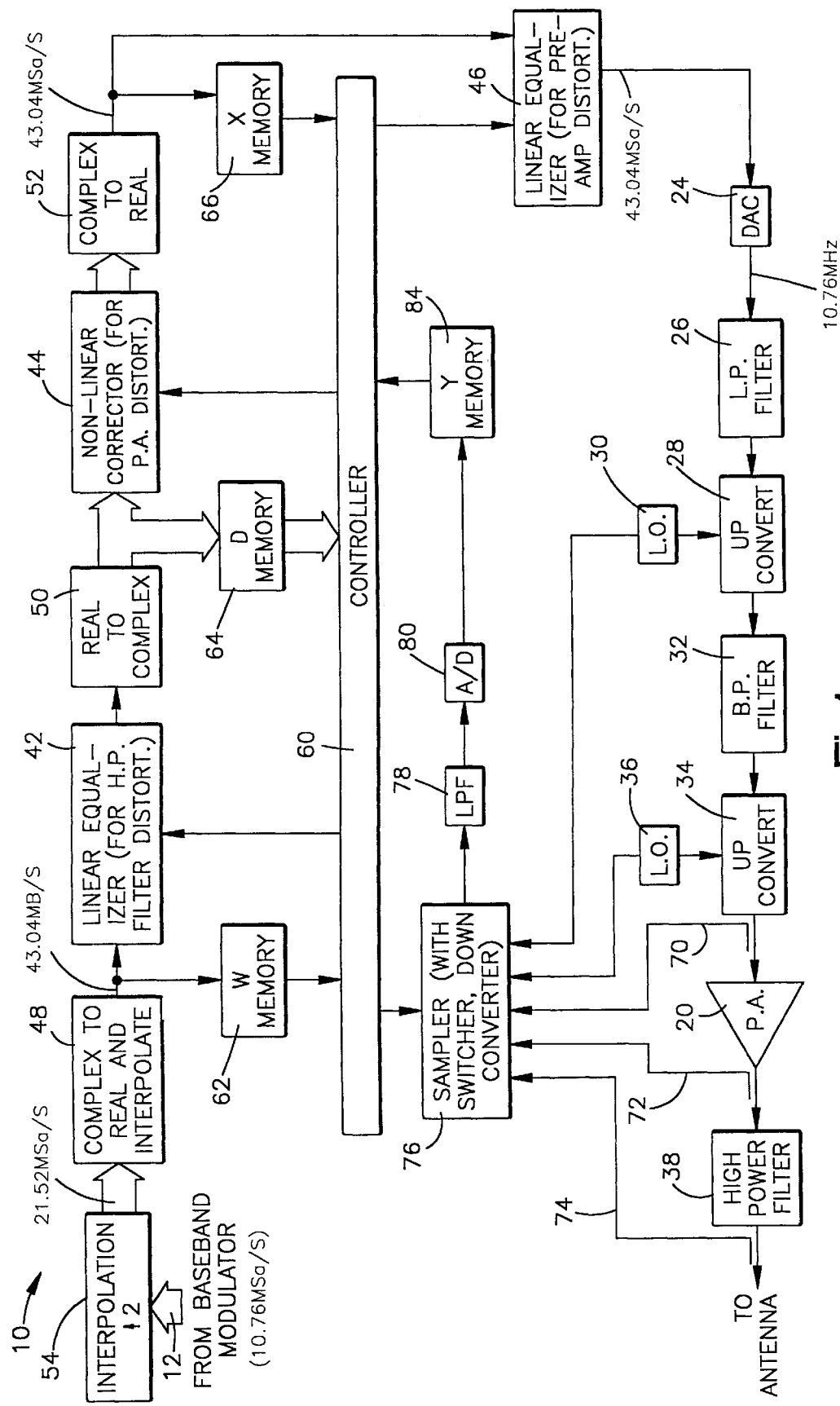
FIG. 1 is a block diagram of an apparatus in accordance with the present invention.
Figure 2:
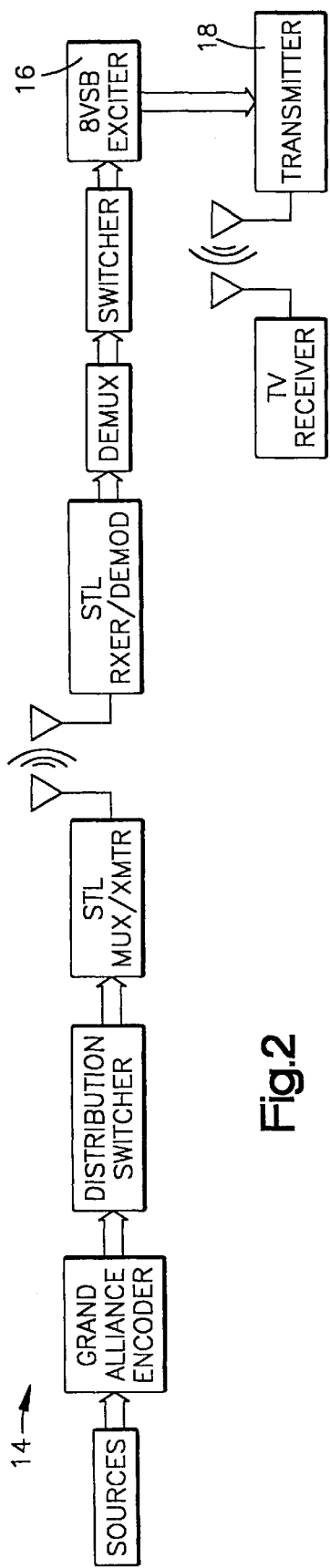
FIG. 2 is a block diagram of an example device in which the present invention is utilized.

One representation of the present invention is an apparatus 10 shown in function block format in FIG. 1 as a plurality of components that define a path of a data stream 12. An information data signal proceeds along the data stream 12. Preferably, the information signal has a relatively high data rate. The high data rate is related to the system environment in which the apparatus 10 is located. Specifically, the apparatus 10 is preferably part of a high definition ("HD") digital television ("DTV") system 14 as shown in FIG. 2. Preferably, the DTV system 14 broadcasts signals in the radio range of frequencies. In one embodiment, the broadcast signal is in the ultrahigh frequency range (300–3000 MHz), and is preferably in the range of 470–860 MHz.

In pertinent part, the DTV system 14 includes an 8VSB exciter 16 and a transmitter 18. The components of the apparatus 10 shown in FIG. 1 are located within the 8VSB exciter 16 and the transmitter 18 of FIG. 2. Specifically, the transmitter 18 includes a power amplifier 20 (FIG. 1) that amplifies the information signal to a power level that is suitable for broadcast transmission of a RF signal. In one example, the amplified power level is 50 kilowatts. The power amplifier 20 may be comprised of an array of amplifying devices. If a plurality of amplifying devices is present within the power amplifier 20, a combiner device is present to combine amplifier device outputs. It is to be understood that various amplifier configurations could be employed.

Turning now to the components located upstream of the transmitter 18 (FIG. 2), many of these upstream components operate in digital format and at certain predetermined data rates. In particular, the 8VSB exciter 16 processes information digitally. Further, at one point within the 8VSB exciter 16, a baseband modulator outputs the information signal in a complex domain, digital format, with an output sample rate equal to the baseband symbol rate. For HDTV, the rate of 10.76 Mega-samples per second (Msa/s).

In distinction, the power amplifier 20 amplifies an analog signal at a desired frequency to convey a relatively high rate of data. Thus, a series of components is located upstream of the power amplifier 20 to convert and condition the information signal to provide the desired input to the power amplifier. Specifically, (starting at the lower right corner of FIG. 1) a digital signal form of the information signal is provided at a predetermined data rate (e.g., 43.04 Msa/s) to a digital-to-analog converter (DAC) 24.

The DAC 24 converts the information signal to analog form. The output frequency may be at any convenient intermediate frequency (IF). In the illustrated embodiment, the output signal frequency is centered at a frequency of 10.76 MHz. A low-pass filter 26 is located downstream of the DAC 24. The output of the low-pass filter 26 is provided to a first up-converter 28 that is driven by a first local oscillator 30. A band-pass filter 32 is interposed between the first up-converter 28 and a second up-converter 34. A second local oscillator 36 drives the second up-converter 34. The output of the second up-converter 34 is at the desired frequency and data rate for amplification by the power amplifier 20.

A post-amplification filter 38 is located downstream of the power amplifier 20. Herein, the post-amplification filter 38 is referred to as a high power filter 38. The high power filter 38 is a band-limiting filter. It is to be appreciated that the transmitter 18 may include other components.

Focusing now upon a theoretical "ideal" system, all of the components of a transmitter of such an ideal system would be ideal. Specifically, a power amplifier of the system would be ideal and the transfer curve for the ideal amplifier would be linear. Thus, within such an ideal system, an information signal having a given pre-amplification power level would be amplified to a predetermined power level by the amplifier, based solely upon a linear relationship that dictates the amount of amplification. Also, filters of the ideal system would not impose any frequency dependent distortions.

The actual power amplifier 20 of the apparatus 10 is, however, not ideal. The actual power transfer curve of the power amplifier 20 is not linear. A non-linear distortion is imposed by the power amplifier 20 upon the information signal during amplification of the information signal. Specifically, the non-linear distortion is directed to changes in instantaneous amplitude and phase variations. Accordingly, a correction is desired upon the information signal to compensate for the distortion caused by the power amplifier 20.

In addition, the filters of the transmitter 18, and specifically the filters 26, 32, and 38, impose linear frequency dependent deformations to the information signal. The low-pass filter 26 imposes a first linear distortion, the band-pass filter 32 imposes a second linear distortion and the high power filter 38 imposes a third linear distortion to the information signal. For example, the distortion imposed by the high power filter 38 is directed to group delay and amplitude response (i.e., amplitude variation versus frequency). Thus, for each distortion that occurs within the transmitter 18, an amount of correction or equalization must be imposed upon the information signal to compensate.

Turning again to the theoretical ideal system, any action (i.e., amplification or filtering) imposed upon the information signal would be time-invariant. Specifically, in the ideal system, the actions imposed upon the information signal would not change over time. Thus, for a given input stimulus, the ideal system always produces the same output, independent of the time at which the stimulus occurs.

However, in actuality, the transmitter 18 is time-variant. Specifically, for a given input stimulus, the outputs of the components of the transmitter 18 change over time. One reason for time-variance is thermal effects within the transmitter 18. The thermal effects cause variations in the amount of signal deformation caused by the power amplifier 20 and the filters 32 and 38 to the information signal. Thus, it is desirable to compensate for all of the signal distortion (i.e., the sequence of linear, non-linear, and linear), and adapt to changes in the distortion.

The apparatus 10 in accordance with the present invention provides three corrector or equalizer (i.e., compensating) components 42–46 within the 8VSB exciter 16 for the distortions that occur within the transmitter 18. The corrector/equalizer components 42–46 are located upstream of the distorting transmitter components. Specifically, all of the corrector/equalizer components 42–46 are upstream of the DAC 24. Thus, the correction/equalization is via pre-distortion of the information signal such that once distortion subsequently occurs at the transmitter 18, the signal has desired values.

Turning to the specifics of the corrector/equalizer components 42–46, an adaptive linear equalizer 42 imposes a pre-distortion onto the information signal to compensate for the linear distortion caused by the high power filter 38. Preferably, the linear equalizer 42 includes at least one Finite Impulse Response ("FIR") digital filter that has suitable structure for pre-compensating or pre-equalizing the information signal to compensate for the linear distortion caused by the high power filter 38. The linear equalizer 42 may be comprised of, or include, a microprocessor that performs a program process and/or may be comprised of, or include, discrete "hard-wired" circuitry. It is to be appreciated that other filter types can be employed (e.g., IIR, a combination of FIR and IIR, or even an analog filter).

An adaptive non-linear corrector 44 imposes a pre-distortion onto the signal to compensate for the non-linear distortion caused by the power amplifier 20. The non-linear corrector 44 may have any suitable structure for pre-distorting (i.e., pre-correcting) the signal to compensate for the non-linearities caused by the power amplifier 20. Specifically, the non-linear corrector 44 may impose a linear piecewise correction curve and an iterative or empirical approach to routinely update a set of correction values within a memory. Alternatively, the correction could be generated by any number of algorithmic processes, such as curve fitting, that tend to provide the inverse distortion inherent in the power amplifier 20. Thus, the non-linear corrector 44 may be comprised of, or include, a microprocessor that performs a program process and/or may be comprised of, or include, discrete "hard-wired," or programmable circuitry.

An adaptive linear equalizer 46 imposes a pre-distortion onto the information signal to compensate for the pre-amplification linear distortion that is primarily caused by low-pass filter 26 and the band-pass filter 32. Preferably, the linear equalizer 46 is a filter that has suitable structure for pre-compensating or pre-equalizing the information signal to compensate for the pre-amplification distortion. The linear equalizer 46 may be comprised of, or include, a microprocessor that performs a program process and/or may be comprised of, or include, discrete "hard-wired" or programmable circuitry.

The linear equalizer 42, the non-linear corrector 44, and the linear equalizer 46 are arranged in a sequence such that the pre-distortions (or pre-corrections) are imposed in a sequential order that is the inverse of the order that distortion occurs. Specifically, because the linear distortion caused by the high power filter 38 occurs last (i.e., at a downstream location from all of the other distortions), the pre-distortion imposed by the linear equalizer 42 occurs first. The pre-distortion imposed by the non-linear corrector 44 occurs second because the non-linear distortion imposed by the power amplifier 20 occurs second. The pre-distortion imposed by the linear equalizer 46 occurs third (i.e., after the pre-distortion from the linear equalizer 42 and the pre-distortion of the non-linear corrector 44) because the pre-amplification linear distortion occurs prior to the distortion caused by the power amplifier 20 and the high power filter 38.

The linear distortion caused by the high power filter 38 must be corrected first (i.e., prior to non-linear correction) such that frequency dependent variations do not impact the non-linear pre-distortion. Such a sequence avoids a problem that a correction is deficient, or even incorrect and in a direction opposite to the direction needed for proper correction. Accordingly, in the correction scheme in accordance with the present invention, the linear effects (such as group delay) of the high power filter 38 are corrected first. Thus, the amplitude and group delay variations over frequency are not misinterpreted as non-linear deformations to the information signal.

Turning to the signal input provided for the pertinent portion of the apparatus 10 shown in FIG. 1, the information signal that is output from the baseband modulator (i.e., complex, digital, and preferably at 10.76 Msa/s) is input to an interpolation component 54. The interpolation component 54 interpolates the complex data stream by two (2) to 21.52 Msa/s. A converter 48 converts the information signal from complex format to real format, and also effectively doubles the sample rate of the information signal (preferably to a rate of 43.04 Msa/s). The output of the complex-to-real converter 48 is the input to the linear equalizer 42. Thus, it is to be appreciated that the corrector/equalizer components 42–46 are located such that all of the correction/equalization occurs at baseband or at a relatively low IF.

As a digression regarding operation of the corrector/equalizer components 42–46 at this data rate, it is to be noted that the non-linear characteristics of the power amplified 20 generic spectral spreading. Prior to the power amplifier 20, the signal bandwidth is confined ideally to a bandwidth set by a Nyquist filter (shaping filter) that is located upstream of the components shown in FIG. 1. The non-linear distortion generated in the power amplifier 20 is broad-band, and extends beyond the Nyquist signal bandwidth. As the non-linearity becomes higher order, the bandwidth gets larger. As examples, a $3^{rd}$ order non-linearity generates spectral spreading of about three times the original bandwidth, and a $5^{th}$ order system equates to about five times the bandwidth.

Since the non-linear corrector 44 is required to correct for all of this spectral splatter, it must be capable of generating correction over the same bandwidth. This means that the signal applied to the non-linear corrector 44 must be over sampled by the same amount as the order of the non-linearities that are to be corrected. The components 54 and 48 allow three times the bandwidth of correction, and thus permit correction of $3^{rd}$ order artifacts.

Turning again to the structure of the apparatus 10, it is to be appreciated that the linear equalizer 42 operates on the signal in the real domain. A real-to-complex converter 50 is located between the linear equalizer 42 and the non-linear corrector 44. Thus, the non-linear corrector 44 operates in the complex domain so that both amplitudes and phase correction can be accomplished. A complex-to-real converter 52 is located between the non-linear corrector 44 and the linear equalizer 46. The linear equalizer 46 and the components of the transmitter 18 operate in the real domain. It is to be appreciated that FIG. 1 shows one embodiment of the linear equalizers. Because the linear equalizers 42 and 46 are real filters, there must be complex-to-real conversions 48 and 52 to allow for real operations on the signal. A real-to-complex converter 50 is needed to return the signal to a complex format preparatory to non-linear correction. If complex equalizers are used, then no complex-to-real pre-conversions and real-to-complex post-conversions are needed.

As stated above, the amount of correction/equalization imposed by the linear equalizer 42, the non-linear corrector 44, and the linear equalizer 46 can be adapted (i.e., updated). A controller 60 determines the amount of change of the correction/equalization for each of the linear equalizer 42, the non-linear corrector 44, and the linear equalizer 46 (e.g., the filter coefficients are changed). In order to make determinations regarding correction/equalization adaptation, the information signal is sampled prior to each correction/equalization component. The signal sample taken prior to the linear equalizer 42 is held within a W memory 62. The signal sample taken prior to the non-linear corrector 44 is held within a D memory 64. The signal sample taken prior to the linear equalizer 46 is held within an X memory 66. In turn, the memories 62–66 are connected to the controller 60 to provide the signal sample values to the controller 60.

Determinations of whether a correction/equalization requires adaptation (i.e., change) require comparisons between the information signal prior to the correction/equalization and the information signal after distortion occurs. Thus, samples of the information signal are taken for each distortion. Specifically, the information signal is coupled-off 70 just prior to the power amplifier 20, such that the linear distortion of the band-pass filter 32, etc. is discernable. The information signal is coupled-off 72 just after the power amplifier 20, such that the non-linear distortion of the power amplifier 20 is discernable. The information signal is coupled-off 74 just after the high power filter 38, such that the linear distortion of the high power filter is discernable.

A sampler 76 selectively samples at one of the three available sample locations (i.e., pre-amp, post-amp, and post-high power filter). The sampler 76 includes a switcher and a down converter. The output of the sampler is passed, via a low-pass filter 78, to an analog-to-digital (A/D) converter 80 and then to an Y memory 84. The Y memory 84 is connected to the controller 60.

The controller 60 controls the sampler 76 to sample one of the three available sample locations (i.e., pre-amp, post-amp, and post-high power filter). The determination of which of the sample locations if chosen is dependent upon the correction/equalization that is to be monitored/adapted. The Y memory 84 thus holds the information signal values that are indicative of the distortion that is needed to make the adaptation determinations. Thus, less processor capacity is required because the controller 60 selectively chooses the distortion to monitor and correct at each moment, and the processing that does occur is at a reduced rate.

Figure 3:
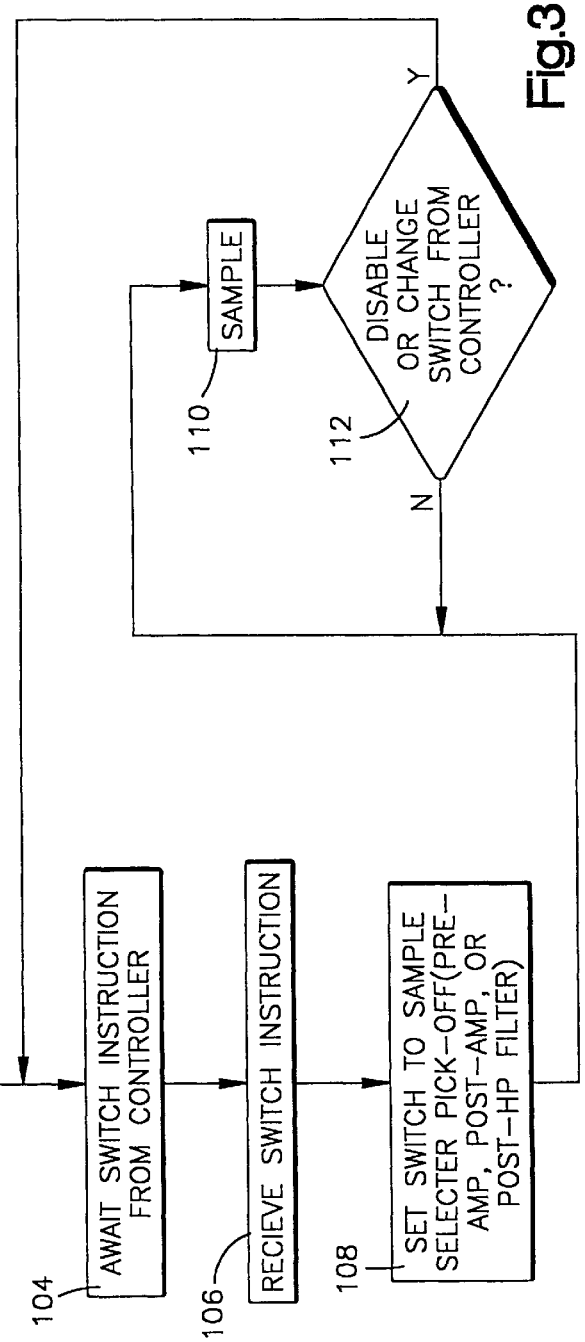
FIG. 3 is a flow chart of a process performed within the apparatus of FIG. 1.

A process 100 for controlling the sampler 76 is shown in FIG. 3. The process 100 begins at step 102 and proceeds to step 104, in which the sampler 76 awaits a switch instruction from the controller 60. At step 106 the controller 60 provides a switch instruction. At step 108, the sampler 76 adjusts its switch setting according to the instruction from the controller 60. The information signal is sampled (step 110) at the chosen "pick-off" location (i.e., pre-amp, post-amp, or post-high power filter). The process 100 goes to step 112 to determine if the controller 60 requests a change (i.e., change or disable the sampler). If the determination at step 112 is negative (i.e., the controller has not provided a new command) the process loops to step 110 and the signal continues to be sampled at the chosen pick-off location. If the determination at step 112 is affirmative (i.e., the controller has provided a new command) the process goes to step 104 to perform the steps 104–108 for switch adjustment.

Figure 4:
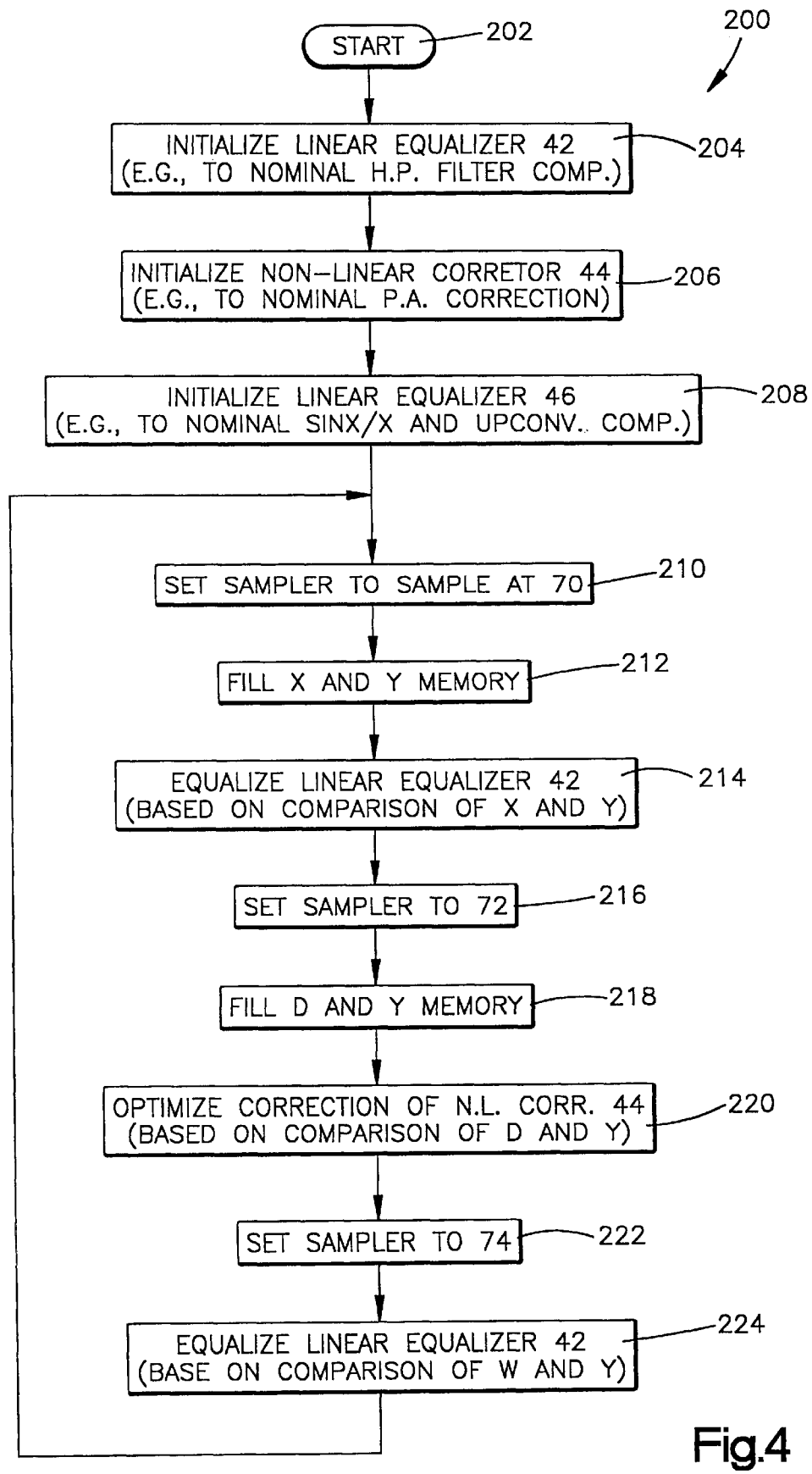
FIG. 4 is a flow chart of a correction/adaptation process performed within the apparatus of FIG. 1.

A process 200 for correction/adaptation is shown in FIG. 4. The process 200 begins at step 202 and proceeds to step 204, in which the linear equalizer 42 is set to provide a predetermined amount of compensation. Preferably, the initial compensation provided by the linear equalizer 42 is a nominal high-power filter compensation. At step 206, the non-linear corrector is initialized to provide an initial predetermined correction. Preferably, the initial correction provided by the non-linear corrector is a nominal power amplifier correction. At step 208, the linear equalizer 46 is initialized to provide a predetermined compensation. Preferably, the initial compensation is a nominal sinx/x and up-converter compensation.

At step 210, the sampler is set to sample at 70. At step 212, the X and Y memories are filled. Linear equalization is provided at equalizer 42 based upon a comparison of the values in the X and Y memories at step 214. At step 216, the sampler is set to 72. The D and Y memories are filled at 218. The correction of the non-linear corrector 44 is optimized based upon a comparison of the values in the D and Y memories at step 220. The sampler is set to 74 at step 222. The linear equalizer 42 is equalized based upon a comparison of the values in the W and Y memories at step 224. Upon the completion of step 224, the process 200 loops back to step 210.

From the above description of the invention, those skilled in the art will perceive improvements, changes and modifications. Such improvements, changes and modifications within the skill of the art are intended to be covered by the appended claims.

Having described the invention, the following is claimed:

1. A broadcast transmitter system comprising:

signal provision means for providing an information signal;

power amplifier means for amplifying the information signal to a broadcast transmission power level;

post-amplification processing means for conditioning the information signal after the information signal is amplified by said power amplifier means, said post-amplification conditioning means being located downstream of said power amplifier means, and said post-amplification conditioning means including a band-limiting filter and subjecting the information signal to distortion shifts away from intended values; and compensating means for modifying the information signal to compensate for the distortion shifts imposed by said post-amplification processing means, said compensating means being located upstream of said power amplifier means.

2. A system as set forth in claim 1 wherein said band-limiting filter shapes the band of the output of the power amplifier means.

3. A broadcast transmitter system comprising:

a signal source that provides an information signal;

a power amplifier that amplifies the information signal to a broadcast transmission power level;

a post-amplification filter, including a band-limiting filter, that conditions the information signal after the information signal is amplified by said power amplifier, said post-amplification filter being located downstream of said power amplifier, and said post-amplification filter subjecting the information signal to distortion shifts away from intended values;

a linear equalizer that modifies the information signal to compensate for the distortion shifts imposed by said post-amplification filter, said linear equalizer being located upstream of said power amplifier.

4. A system as set forth in claim 3 wherein said band-limiting filter shapes the band of the output of the power amplifier.

5. A broadcast transmitter system comprising:

a signal source that provides an information signal;

a power amplifier that amplifies the information signal to a broadcast transmission power level, said power amplifier subjecting the information signal to distortion shifts away from intended values;

a pre-amp filter that conditions the information signal before the information signal is amplified by said power amplifier, said pre-amp filter being located upstream of said power amplifier, and said pre-amp filter subjecting the information signal to distortion shifts away from intended values;

a post-amplification filter that conditions the information signal after the information signal is amplified by said power amplifier, said post-amplification filter being located downstream of said power amplifier, and said post-amplification filter subjecting the information signal to distortion shifts away from intended values;

a first linear equalizer that modifies the information signal to compensate for the distortion shifts imposed by said post-amplification filter, said first linear equalizer being located upstream of said pre-amp filter;

a non-linear corrector that modifies the information signal to compensate for the distortion shifts imposed by said power amplifiers, said non-linear corrector being located downstream of said first linear equalizer and upstream of said pre-amp filter; and a second linear equalizer that modifies the information signal to compensate for the distortion shifts imposed by said pre-amp filter, said second linear equalizer being located downstream of said non-linear corrector and upstream of said pre-amp filter.

6. A system as set forth in claim 5 including a first sample coupling that couples off a first sample of the information signal after said pre-amp filter and before said power amplifier, and a controller that utilizes the first sample to determine the modification to be imposed by said second linear equalizer on the information signal.

7. A system as set forth in claim 6 including a second sample coupling that couples off a second sample of the information signal after said power amplifier and before said post-amplification filter, and wherein said controller utilizes the second sample to determine the modification to be imposed by said non-linear corrector on the information signal.

8. A system as set forth in claim 7 including a third sample coupling that couples off a third sample of the information signal after said post-amplification filter, and wherein said controller utilizes the third sample to determine the modification to be imposed by said first linear equalizer on the information signal.

9. A system as set forth in claim 5, wherein the information signal is provided as a complex format signal, said system includes a first converter that converts the information signal from complex format to real format, said first converter is located upstream of said first linear equalizer, said first linear equalizer modifies the information signal in real format.

10. A system as set forth in claim 9 including a second converter that converts the information signal from real format to complex format, said second converter is located downstream of said first linear equalizer and upstream of said non-linear corrector, said non-linear corrector modifies the information signal in complex format.

11. A system as set forth in claim 10 including a third converter that converts the information signal from complex format to real format, said third converter is located downstream of said non-linear corrector and upstream of said second linear equalizer, said second linear equalizer modifies the information signal in real format.

* * * * *